United States Patent [19]
Noro

[11] Patent Number: 5,347,230
[45] Date of Patent: Sep. 13, 1994

[54] AMPLIFICATION CIRCUIT

[75] Inventor: Masao Noro, Hamamatsu, Japan

[73] Assignee: Yamaha Corporation, Japan

[21] Appl. No.: 900,194

[22] Filed: Jun. 17, 1992

[30] Foreign Application Priority Data

Jun. 20, 1991 [JP] Japan .................. 3-176094

[51] Int. Cl.⁵ .............. H03F 3/26; H03F 3/38
[52] U.S. Cl. ...................... 330/297; 330/10; 330/263
[58] Field of Search ............ 330/123, 127, 263, 267, 330/296, 297, 10

[56] References Cited

U.S. PATENT DOCUMENTS

| | | | |
|---|---|---|---|
| 4,115,742 | 9/1978 | Yokoyama | 330/297 |
| 4,378,530 | 3/1983 | Garde | 330/297 |
| 4,430,625 | 2/1984 | Yokoyama | 330/297 |
| 4,472,687 | 9/1984 | Kashiwagi et al. | 330/297 |
| 4,498,057 | 2/1985 | Noro | 330/297 |
| 4,507,619 | 3/1985 | Dijkstra et al. | 330/297 |
| 4,516,080 | 5/1985 | Garde | 330/3 |
| 4,523,152 | 6/1985 | Garde | 330/151 |

FOREIGN PATENT DOCUMENTS

2-49212 4/1990 Japan .

*Primary Examiner*—Steven Mottola
*Attorney, Agent, or Firm*—Graham & James

[57] ABSTRACT

An amplification circuit for power amplification of an audio signal or other signal includes a main power source line for supplying a driving power to a load, a switching element inserted in the main power source line for turning on and off the main power line, a smoothing circuit inserted in the main power line for smoothing an output of the switching element, a switching control circuit for switching the switching element with a variable on-off ratio in accordance with the level of an input signal, an auxiliary power source line capable of responding to changes in the level of the input signal at a higher speed than the main power line to supply power to the load, an auxiliary power supply amount adjusting element inserted in the auxiliary power line to adjust the power supply amount from the auxiliary power source line to the load, and an auxiliary power supply amount control circuit for controlling the auxiliary power supply adjusting element to cause power corresponding to any deficiency of power supplied by the main power source line to be supplied from the auxiliary power source line. The amplification circuit is driven by a power voltage capable of supplying substantially a maximum output from the auxiliary power source line to the load regardless of any deficiency of the power supply amount to the load by the main power source line.

8 Claims, 11 Drawing Sheets

AMPLIFICATION CIRCUIT

BACKGROUND OF THE INVENTION

This invention relates to an amplification circuit used for power amplification of an audio signal or other signal and, more particularly, to an amplification circuit with improved efficiency and with improved response characteristic to a sharp rise of a large amplitude input.

Figure 2:
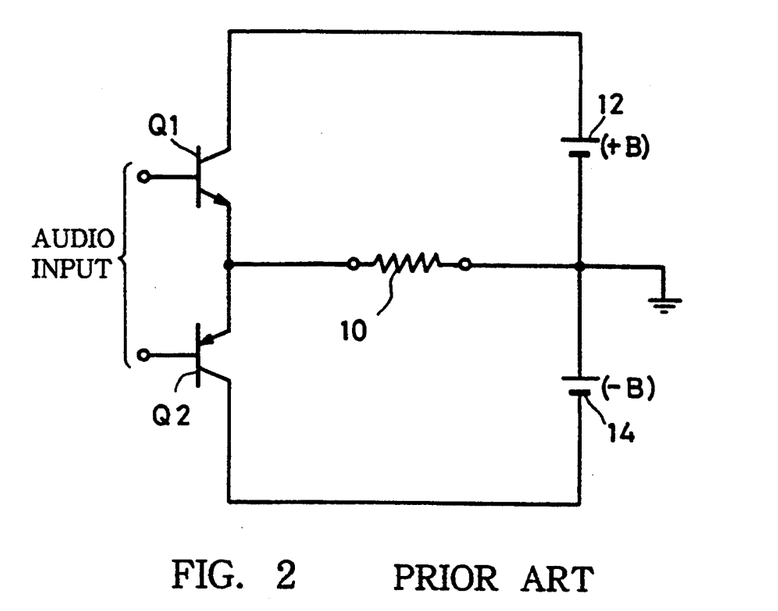
FIG. 2 is a circuit diagram showing a general prior art amplification circuit.

As a power amplification circuit for audio signals, an SEPP (single ended push-pull) circuit as shown in FIG. 2 is generally employed. In this circuit, transistors Q1 and Q2 constitute a push-pull circuit in which a signal from a prior stage is received to bases of these transistors and the input signal is amplified by a power supplied from power sources 12 and 14 to drive a load (e.g.,loudspeaker) 10.

Since, in this circuit, the transistors Q1 and Q2 are driven by source voltages +B and −B from which a maximum output can always be provided, this circuit has the disadvantage that power loss (amount of heat generation) in the transistors Q1 and Q2 is large even when an input signal of a small level is applied.

Figure 3:
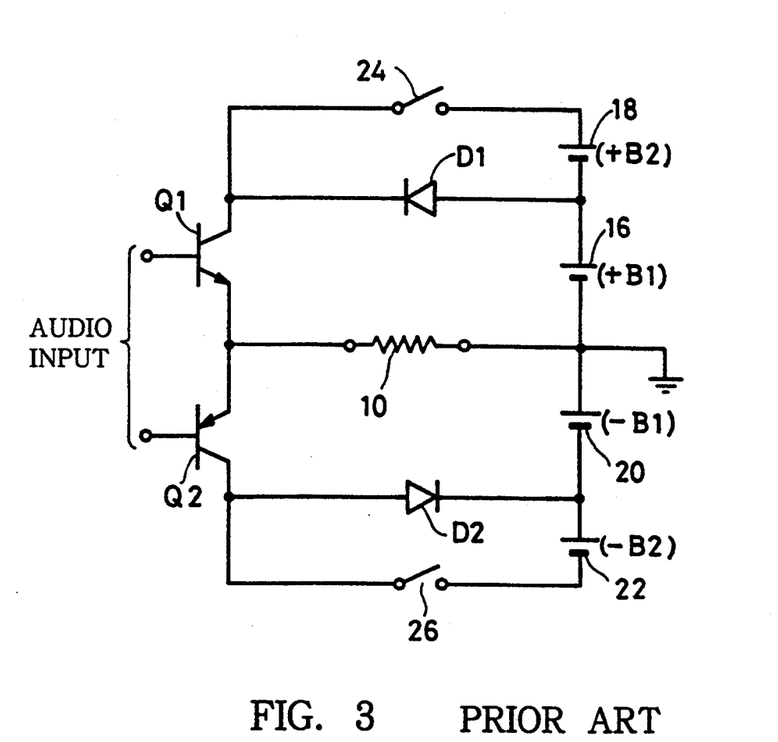
FIG. 3 is a circuit diagram showing a prior art amplification circuit of a voltage switching type.

For solving this problem, there has been proposed a voltage switching system as shown in FIG. 3. In this system, source voltage used is switched depending upon the magnitude of an input signal. Power sources 12 and 14 of FIG. 2 are respectively divided in two power sources 16, 18 and 20, 22 (B=B1+B2) and the source voltage of transistors Q1 and Q2 is switched by switches 24 and 26 and diodes D1 and D2. More specifically, when the input signal level is small, the switches 24 and 26 are turned off and the transistors Q1 and Q2 are driven by the source voltages +B1 and −B1. When the input signal level has increased and therefore the source voltages +B1 and −B1 alone cannot supply necessary power to the load 10 any more, the switches 24 and 26 are turned on to drive the transistors Q1 and Q2 by source voltages (+B1)+(+B2) and (−B1)+(−B2).

Figure 4:
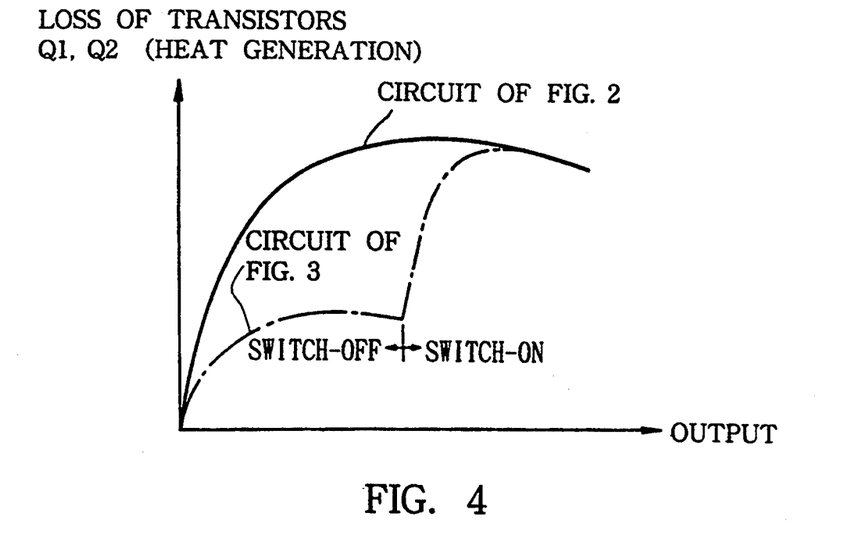
FIG. 4 is a characteristic diagram of loss in the circuits of FIGS. 2 and 3.

Since the transistors Q1 and Q2 in this circuit are driven by low voltages +B1 and −B1 when a signal of a small level is applied, loss during application of a small level signal can be reduced as shown in FIG. 4 in comparison with the circuit of FIG. 2 having no voltage switching function. After turning on the switches 24 and 26, however, loss becomes as large as the circuit of FIG. 2 as shown in FIG. 4. In an audio signal for music, variation in amplitude is generally large and probability of switching is very high even though its average power is small. Improvement of efficiency in a large scale in an amplification circuit therefore is rather difficult.

Figure 5:
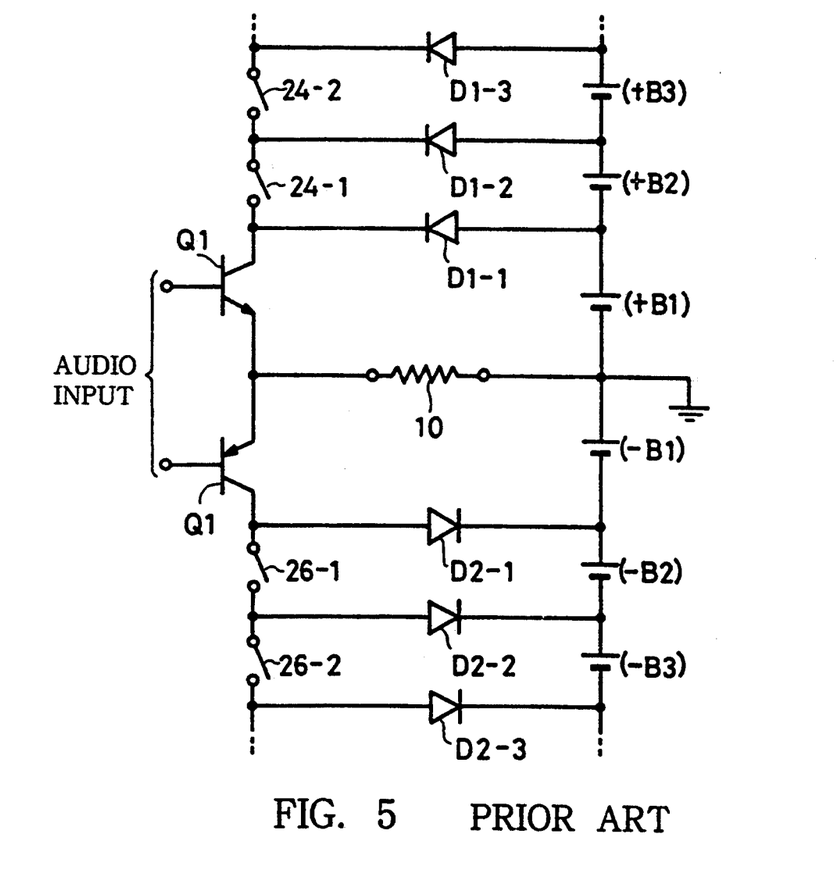
FIG. 5 is a circuit diagram of a prior art amplification circuit of a voltage switching type performing multi-stage switching.

It is theoretically possible to improve efficiency by increasing, as shown in FIG. 5, the number of voltage switching stages, i.e., the number of division of the power source +B. This structure, however, requires increase in power sources, switches and diodes with resulting complex and large scale circuit design. Moreover, in actual circuit design, power loss due to passing through many switches increases and, the provision of the voltage switching stages will be limited to two or three stages as a proper number of stages and, in this case, a large scale improvement in efficiency will be difficult.

Figure 6:
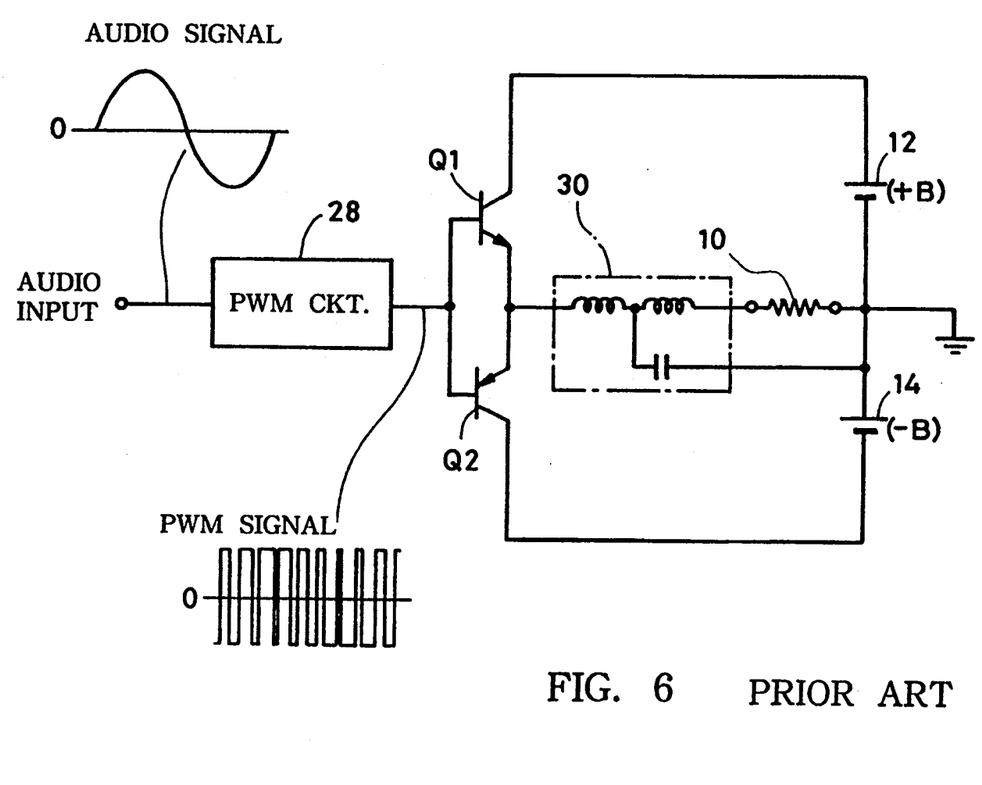
FIG. 6 is a circuit diagram showing a prior art PWM amplifier.

There has been used a PWM (pulse width modulation) amplifier as shown in FIG. 6 for improving efficiency. An input such as an audio signal from a preamplifier is applied to a PWM circuit 28 and a PWM signal having duty factors corresponding to signal levels at respective time points of the input audio signal waveform is produced. Push-pull transistors Q1 and Q2 in the output stage are alternately switched by this PWM signal to supply power from the power sources 12 and 14 to a load 10. According to this construction, the transistors Q1 and Q2 are switching-driven and therefore loss during a large output becomes small and efficiency thereby can be greatly improved.

Figure 7:
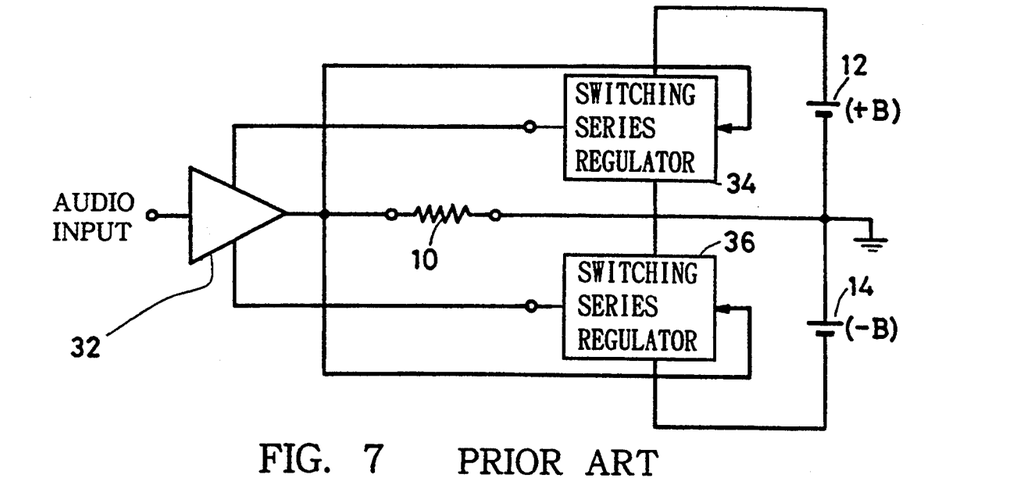
FIG. 7 is a circuit diagram showing a prior art amplification circuit of a switching series regulator system.
Figure 8:
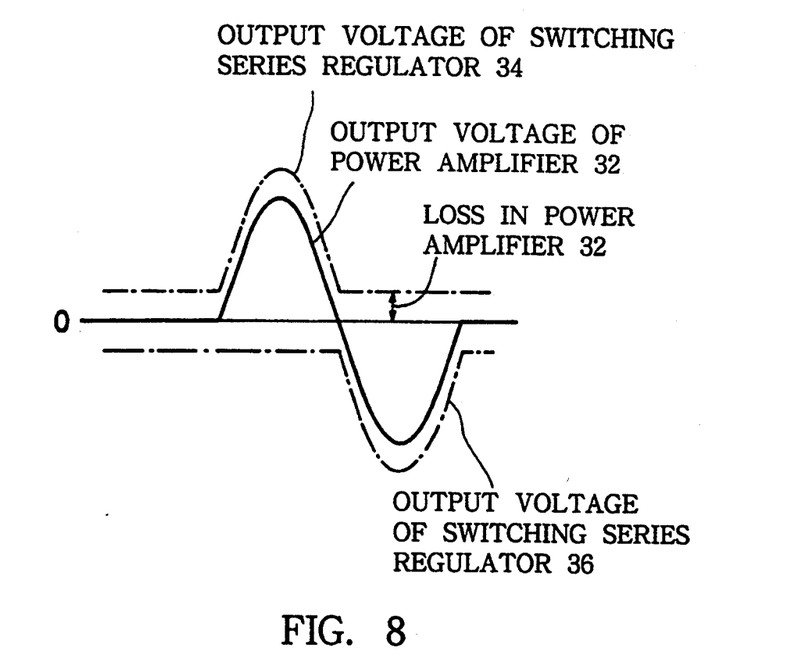
FIG. 8 is a waveform diagram for showing the operation of the circuit of FIG. 7.

There is another conventional power amplification circuit designed for improving efficiency as shown in FIG. 7. In this circuit, a power amplifier 32 is driven by voltages dropped from source voltages +B (12) and −(14) by using switching series regulators 34 and 36 and loss in the power amplifier 32 thereby is reduced. The switching series regulators 34 and 36 drop the source voltages +B and −B to voltages which are sufficient and necessary for taking out necessary power from the power amplifier 32, by variably switching on-off ratio in accordance with the output (or input) of the power amplifier 32. According to this circuit, as shown in FIG. 8, output voltages of the switching series regulators 34 and 36 change in accordance with the output voltage of the power amplifier 32, so that loss of an output transistor in the power amplifier 32 becomes substantially of a constant value regardless of magnitude of the output of the power amplifier 32. Moreover, since the switching series regulators 34 and 36 are driven in switch-driving, loss in the switching series regulators 34 and 36 is also small and the efficiency as a whole can be greatly improved.

The amplifiers shown in FIGS. 6 and 7, however, have the following drawbacks.

In the PWM amplifier shown in FIG. 6, a filter circuit 30 is inserted between output terminal of the transistors and the load 10 for demodulating a PWM signal provided by the transistors Q1 and Q2 to an audio signal. This causes a speed of rising operation of the amplifier (through rate) to decrease with the result that the amplifier cannot respond sufficiently to a sharp rise characteristic due to a large amplitude of an audio input signal. The speed of response can be improved to some degree by increasing the cutoff frequency of the filter circuit 30 by increasing the switching frequency (frequency of the PWM signal). The increase in the switching frequency, however, increases the number of switching which causes drop in efficiency due to switching loss. This reduces the merit of adopting switching drive. For this reason, with switching frequency within a practical range, the amplifier cannot respond sufficiently to a sharp rise to a large amplitude of an audio input signal.

In the circuit of FIG. 7, the switching series regulators 34 and 36 include a smoothing circuit for smoothing a switching output waveform and supplying the smoothed output to the power amplifier 32. This prevents power supply from responding quickly to a sharp rise due to a large amplitude input with resulting clipping of the output of the power amplifier 32.

It is, therefore, an object of the invention to provide a amplification circuit having an improved efficiency and improved response to a sharp rise characteristic due to a large amplitude of an input signal.

SUMMARY OF THE INVENTION

For achieving the object of the invention, an amplification circuit comprises power amplifying means for amplifying an input signal, the power amplifying means capable of being driven by receiving a source voltage, a power source, main power source supplying means for supplying a source voltage from said power source to said power amplifying means, said main power source supplying means comprising, a switching element, provided between said power amplifying means and said power source, for switching transmission of said power source and said power amplifying means, smoothing means for smoothing a switching output through the switching element and switching control means for controlling a switching operation of the switching element, auxiliary power source supplying means for supplementing a deficiency of a necessary source voltage to normally drive the power amplifying means with supply of the source voltage from said main power source supplying means.

According to the invention, power supply to the load is mainly made from the main power line which supplies current in switching drive and, accordingly, loss can be reduced. In the case of a sharp rise time of an input which the main power line cannot cope with due to existence of a smoothing circuit therein, power supply is made from the auxiliary power line having a quicker response characteristic than the main power line, so that such sharp rise to a large amplitude can be sufficiently coped with. Moreover, since the auxiliary power line is driven by a source voltage capable of supplying substantially a maximum output to the load regardless of magnitude of deficiency of power supply amount to the load by the main power line, no clipping of the output takes place. Although the auxiliary power line is driven by such source voltage, the power supply is normally made mainly by the main power line and, therefore, an average current value of current flowing through the auxiliary power line can be small and therefore loss in the auxiliary power line can be small. Thus, an amplification circuit having an improved efficiency and having an excellent response characteristic to a sharp rise of a large amplitude input can be realized.

Embodiments of the invention will be described below with reference to the accompanying drawings.

BRIEF DESCRIPTION OF THE DRAWINGS

In the accompanying drawings.

DESCRIPTION OF PREFERRED EMBODIMENTS

Embodiments of the invention will now be described.

EMBODIMENT 1

Figure 1:
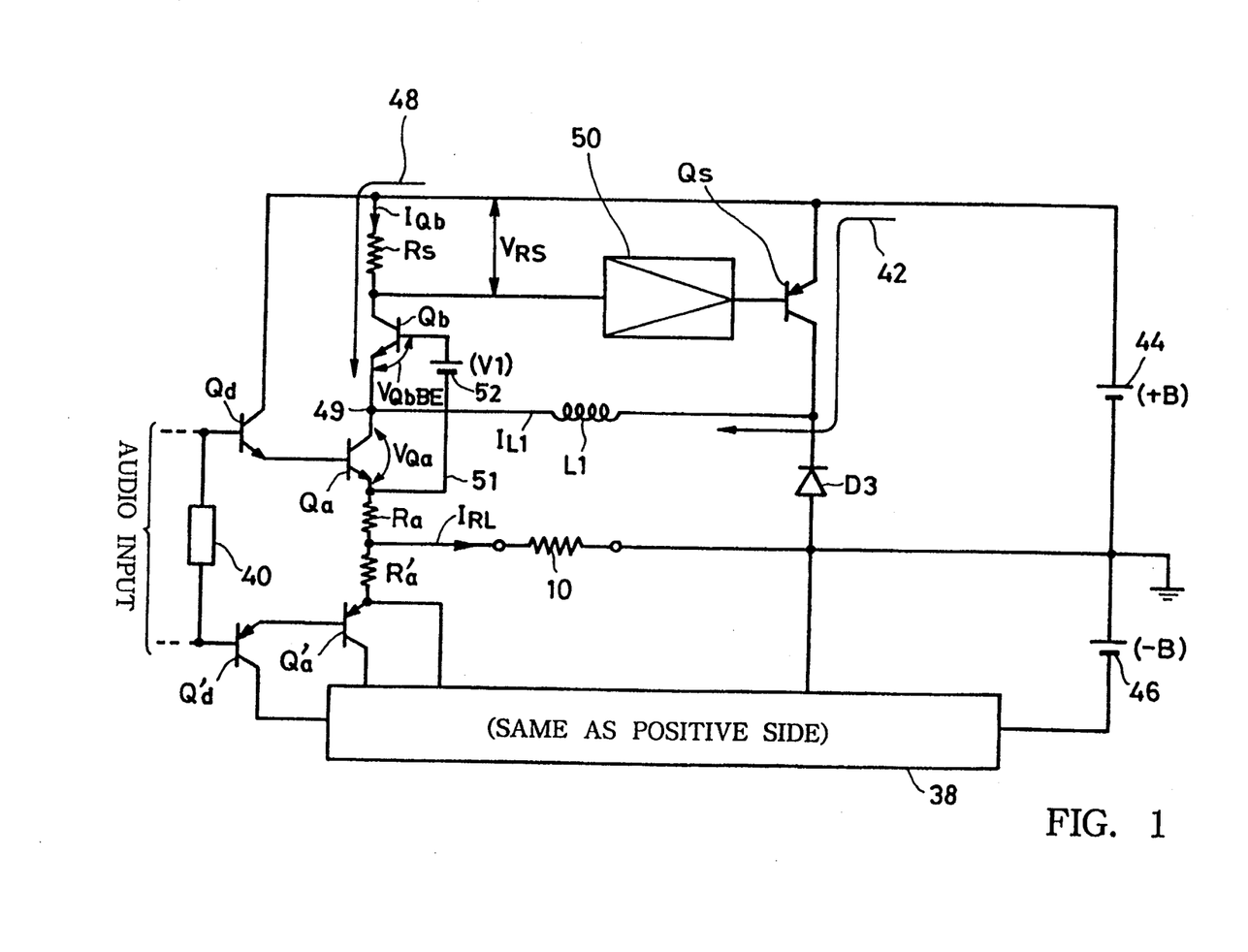
FIG. 1 is a circuit diagram showing a first embodiment of the invention.

FIG. 1 shows an embodiment of the invention. In FIG. 1, a circuit of the positive side only is illustrated. A negative side circuit 38 is constructed in the same manner as the positive side circuit and is driven by a power source 46 (power voltage $-B$). The following description will be made about the positive side circuit only.

An audio signal is applied to transistors Qd and Qd' of a drive stage to drive transistors Qa and Qa' of an output stage and thereby supply necessary power to a load (i.e., loudspeakers) 10.

A main power source line 42 for mainly supplying main supply source voltage to the load 10 consists of a power source 44 (source voltage $+B$), a switching transistor Qs (switching element), a smoothing inductor L1 (smoothing circuit), an output stage transistor Qa and resistance Ra. An auxiliary power source line 48 for supplying a portion of necessary power which the main power source line 42 cannot satisfy consists of the power source 44, resistance Rs, a transistor Qb (auxiliary power supply amount adjusting element), the output stage transistor Qa and resistance Ra.

The resistance Rs is small resistance for detecting current IQb flowing through the auxiliary power source line 48. Voltage VRs produced across the resistance Rs by the current IQb is applied to a hysteresis comparator 50. The hysteresis comparator 50 and the resistance Rs constitute switch control means for the transistor Qs. The comparator 50 produces "0" when the voltage VRs has exceeded a predetermined upper limit value (upper reference voltage) VHCH and thereby causes the transistor Qs to be turned on and maintains "0" until the voltage VRs has dropped to a predetermined lower limit value VHCL. When the voltage VRs has dropped below the lower limit value VHCL, the comparator 50 produces "1" and thereby causes the transistor Qs to be turned off and maintains "1" until the voltage VRs has exceeded the upper limit value VHCH. The transistor Qs thereby performs a switching operation. The smoothing coil L1 smoothes an output waveform of the transistor Qs produced by this switching operation and supplies the smoothed output to the load 10. A diode D3 is a flywheel diode forming a current path of current flowing from the smoothing coil L1 when the transistor Qs is off.

A dc power source 52 is connected between the emitter of the output transistor Qa and the base of the transistor Qb. Power voltage V1 thereof is set to (V1=VQamin+VQbBE). VQamin is minimum voltage at which the output transistor Qa can secure linearity at its maximum output and is normally about 2 V to 3 V. VQbBE is base-emitter voltage of the transistor Qb which is about 0.6 V when the transistor Qb is on. A path 51 leading from the emitter of the transistor Qa to the base of the transistor Qb through the power source 52 constitutes auxiliary power supply amount control means.

The operation of the circuit of FIG. 1 will now be described. Let us assume now that the output of the hysteresis comparator 50 is "1" and the switching transistor Qs is off. An audio input signal is supplied to the output stage transistor Qa through the transistor Qd and, as a result, the transistor Qa is turned on. The current IQb thereby flows to the transistor Qa via the auxiliary power line 48 and is supplied to the load 10. The voltage VRS is produced across the resistance Rs by this current IQb. When the voltage VRs has reached the upper limit value VHCH, the output of the hysteresis comparator 50 is inverted to "0" and thereby causes the transistor Qs to be turned on. This enables current to be supplied from the main power source line 42.

Since total resistance value of the main power source line 42 is smaller than total resistance value of the auxiliary power source line 48 when the transistor Qs is on, once the transistor Qs has been turned on, current IL1 from the main power source line 42 increases and current IQb from the auxiliary power source line 48 decreases by the amount of increase in the main power source line 42. The currents IL1 and IQb are added together at an addition point 49 and sum current (IL1+IQb) is supplied as load current IRL to the load 10 through the transistor Qa. Necessary power is thereby supplied to the load 10.

Immediately before the current IQb from the auxiliary power source line 48 becomes 0, the voltage VRS across the resistance Rs reaches the lower limit value VHCL and the output of the comparator 50 is turned to "1" whereby the transistor Qs is turned off. When the transistor Qs has been turned off, the current IL1 of the smoothing coil L1 flows through the diode D3. As this current IL1 decreases gradually, the current IQb of the auxiliary power source line 48 increases and, when the voltage VRs has reached the upper limit value VHCH, the output of the comparator 50 is turned to "0" thereby causing the transistor Qs to be turned on. This operation is subsequently repeated. In the above described manner, transistor Qs is switched by self-oscillation with the ratio of the on-period and off-period varying depending upon the level of the audio input signal.

According to this operation, the transistor Qb is always in an active state and the current IRL flowing from the transistor Qa to the load 10 is supplied from both the main power source line 42 and the auxiliary power source line 48. Since the transistor Qs of the main power source line 42 is driven in switching, loss in the transistor Qs is relatively small. In the auxiliary power source line 48, loss thereof is caused in the transistor Qb. Since, however, the current IQb flowing through the transistor Qb can be reduced substantially to the same amount as a ripple current of the output current IL1 of the smoothing inductor L1 by respectively adjusting limit values VHCH and VHCL of the resistance Rs and the hysteresis comparator 50, the current IL1 becomes much smaller than the current IQb and, as a result, the loss in the transistor Qb can be held at a small value.

Moreover, the transistor Qb is always on and the voltage VQbBE is about 0.6 V, the collector-emitter voltage VQa of the output stage transistor Qa is always maintained at $VQa = V1 - VQbBE = VQamin$. Accordingly, the loss of the output stage transistor Qa can be held at the minimum. According to the circuit of FIG. 1, therefore, a great advantage can be obtained by holding the loss of the output stage transistor Qa at the minimum.

Figure 9:
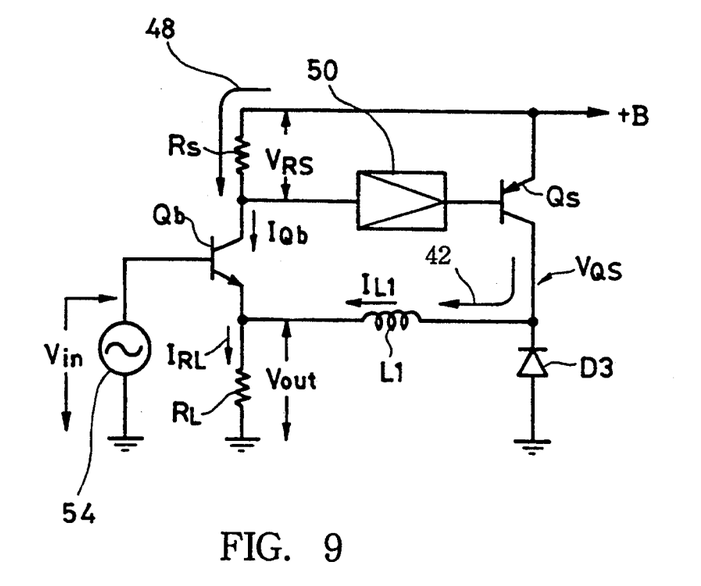
FIG. 9 is a circuit diagram showing a portion of the circuit of FIG. 1 including transistors Q1 and Q2.
Figure 10:
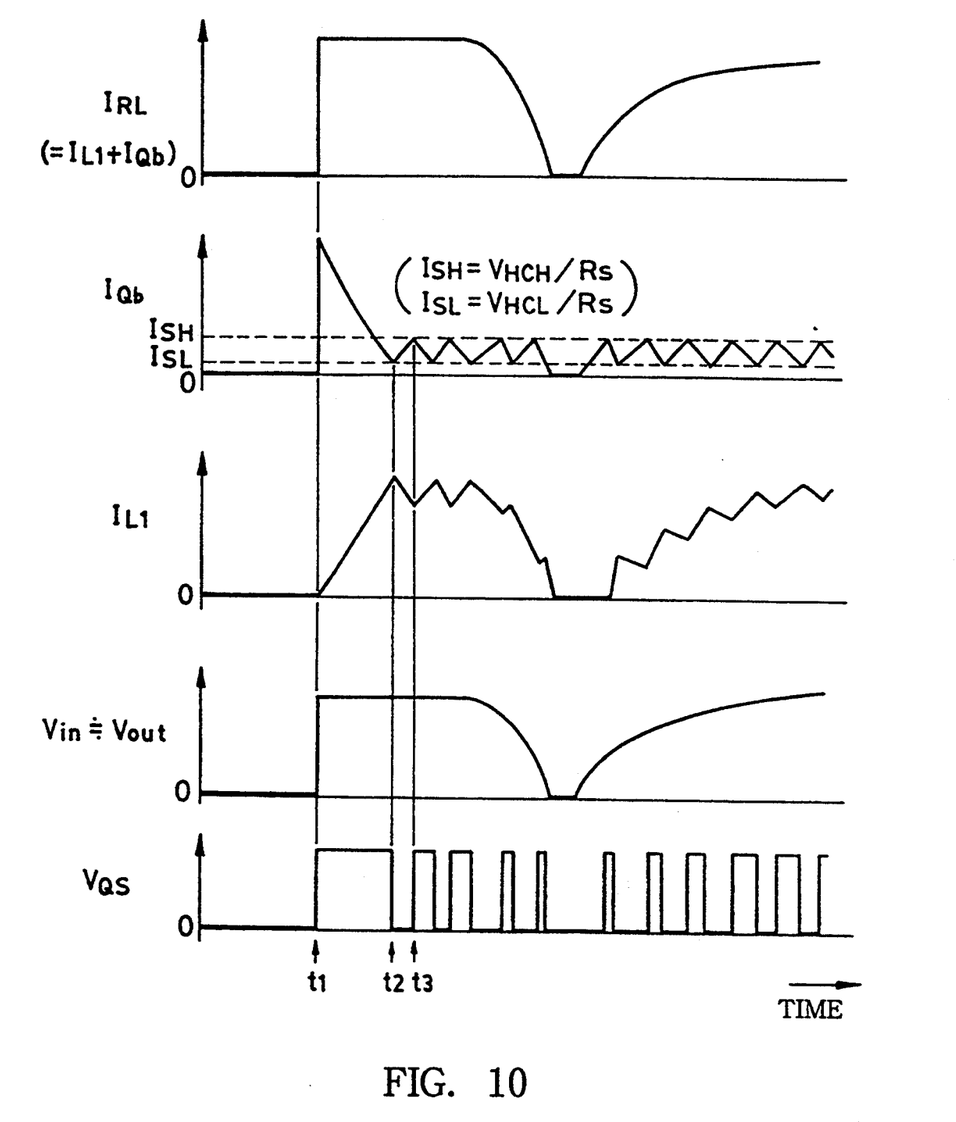
FIG. 10 is a waveform diagram for showing the operation of the circuit of FIG. 9.

FIG. 9 shows a portion of FIG. 1 including the transistors Qb and Qs. The operation of this circuit portion will be described with reference to FIG. 10. When a step-like input voltage Vin has been applied from the signal source 54 to the transistor Qb (time t1 in FIG. 10), all the output current IRL is initially supplied from the transistor Qb of the auxiliary power line 48, for the transistor Qs initially is off. Then the current IQb of the transistor Qb increases quickly and the voltage VRs across the resistance Rs reaches the upper reference voltage VHCH of the comparator 50. The output of the comparator 50 thereupon is turned to "0" to cause the transistor Qs to be turned on. Supply of power from the main power source line 42 is thereby started. The current IL1 from the main power source line 42 does not increase quickly but increases gradually because there is the smoothing inductor L1. As the main current IL1 increases gradually, the auxiliary current IQb which is $IQb = IRL - IL1$ decreases gradually. When the auxiliary current IQb has decreased and the voltage VRs has reached the lower reference voltage VHCL of the comparator 50 (time t2), the transistor Qs is turned off and the output current IL1 of the smoothing inductor L1 decreases gradually. This causes the auxiliary current IQb to increase and, when the voltage VRs has reached the upper reference voltage VHCH (time t3), the transistor Qs is turned on again. Subsequently, the same operation is repeated if the same audio input signal is supplied. In the initial rising portion (immediately after the time t1), the output current IL1 of the smoothing inductor L1 does not catch up with the input Vin soon so that power is supplied mainly by the auxiliary current IQb. When there is not much variation in the input Vin and there is not much variation either in the load current IRL, power is supplied mostly from the main power source line 42. Since a high frequency component (i.e., a signal which varies largely) of a musical signal has a relative small energy, even if power of the high frequency component is supplied from the auxiliary power source line 48, average value of the auxiliary current IQb is small and, therefore, most of the load current IRL is supplied as the current IL1 from the main power source line 42 as a high efficient source line by the switching drive. Further, in the circuit of FIG. 1, the load current IRL is all supplied from the transistor Qa (Q'a). As described above, since only the minimum voltage VQamin necessary for turning on the transistor Qa is applied as the collector-emitter voltage VQa of the transistor Qa, loss in this portion is very small. Accordingly, efficiency as a whole in the circuit becomes very high. Moreover, for the sharp rise time of the input Vin, power is supplied from the auxiliary power source line 48 which is of a quicker response and, therefore, necessary power can be supplied to the load 10 following this sharp rise sufficiently. Besides, since the auxiliary power source line 48 is driven by the high voltage +B as in the main power source line 42, it can supply predetermined maximum output to the load without clipping of output even in the sharp rising portion of an input of a large amplitude.

The circuit of FIG. 1 is beneficial also in acoustic characteristics. Since the transistor Qb is not cut off, it is always in an active state with a small current and operates in such a manner that a ripple portion of the main current IL1 occurring due to the switching operation is absorbed by varying the current IQb from the transistor Qb in accordance with the ripple portion. Therefore, the voltage supplied to the output stage transistor Qa has no ripple voltage whereby influence of the ripple voltage over the output is eliminated and deterioration of the distortion factor and S/N due to the switching drive can be prevented.

In the circuit of FIG. 1, by setting the upper reference voltage VHCH of the hysteresis comparator 50 at a sufficiently small value, the average value of the auxiliary current IQb can be made small and the loss in the transistor Qb can thereby be reduced. This, however, increases the switching frequency of the transistor Qs with a resulting increase in switching loss. Accordingly, the value of the upper reference voltage VHCH should preferably be determined in such a manner that sum of the loss in the transistor Qb and the switching loss in the transistor Qs will become the minimum. For reducing the loss, the lower reference voltage VHCL should preferably be as small as possible within a range in which the transistor Qb will not be cut off. In a case where a bipolar transistor is used, upper limit of self running switching frequency of the transistor Qs can be set at about 100 kHz (the self running frequency varies depending upon the output). When the upper limit is set at a frequency more than 100 kHz, a power MOS transistor may be used if a bipolar transistor cannot sufficiently perform the switching function.

Figure 11:
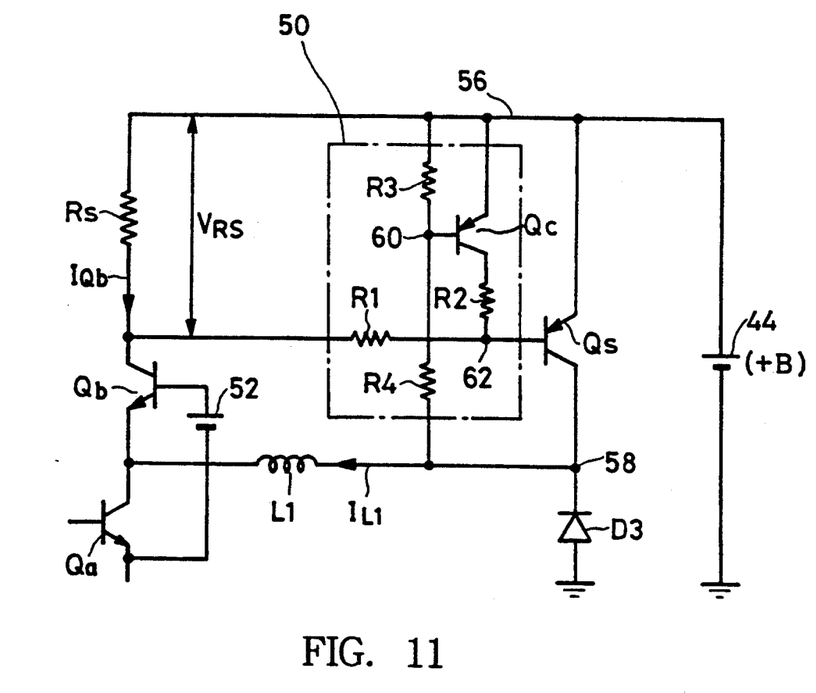
FIG. 11 is a circuit diagram showing a specific example of a hysteresis comparator 50 in FIG. 1.

An example of the hysteresis comparator 50 is shown in FIG. 11. A circuit of serially connected resistances R3 and R4 is connected between a power source line of +B and a junction 58 between a transistor Qs and a diode D3. A circuit of serially connected transistor Qc and resistances R2, R1 is connected across resistance Rs. A junction 60 of resistances R3 and R4 is connected to the base of the transistor Qc and a junction 62 of resistances R1 and R2 is connected to the base of the switching transistor Qs.

According to this construction, the transistor Qc is on due to voltage produced across the resistance R3 when the transistor Qs is off. At this time, voltage obtained by dividing voltage VRs by the resistances R1 and R2 is applied to the transistor Qs. In this state, if the auxiliary current IQb increases, the voltage VRs increases and the base-emitter voltage of the transistor Qs increases to about 0.6 V. This causes the transistor Qs to be turned on and the main current IL1 thereby flows. Upon turning on of the transistor Qs, the potential at the junction 58 rises to about +B and, therefore, the potential at the junction 60 also rises and the transistor Qc is thereby turned off. As the main current IL1 increases due to turning on of the transistor Qs, the auxiliary current IQb decreases and the voltage VRs decreases. When the transistor Qc is off, the voltage VRs is applied directly as the base-emitter voltage of the transistor Qs through the resistance R1 and, accordingly, the transistor Qs is turned off when this voltage VRs drops below about 0.6 V. Upon turning off of the transistor Qs, the potential of the junction 58 drops and the transistor Qc is thereby turned on.

In the above described manner, according to the hysteresis comparator 50 of FIG. 11, when the transistor Qs is off, the voltage obtained by dividing the voltage VRs by the resistances R1 and R2 is applied as the base-emitter voltage of the transistor Qs. Therefore, the transistor Qs is turned on only when the voltage VRs has increased to the point at which voltage of about 0.6 V or over is produced across the resistance R2. When the transistor Qs is on, the voltage VRs is applied directly as the base-emitter voltage of the transistor Qs through the resistance R1. Therefore, the transistor Qs is turned off when the voltage VRs drops below about 0.6 V. A comparator operation having hysteresis is thereby realized and the transistor Qs performs the switching operation by self-oscillation.

The lower reference voltage VHCL is determined on the basis of the value of the resistance Rs. The upper reference voltage VHCH is determined on the basis of the ratio of the resistances R1 and R2 so that the larger the value of the resistance R1 over the value of the resistance R2, the larger becomes the reference voltage VHCH.

The hysteresis comparator 50 is not limited to the one of FIG. 11 but can be constructed in various manners such as employing an operational amplifier. The hysteresis comparator 50 of FIG. 11 however is advantageous in that it can be realized easily because it does not need a separate power source for the comparator.

Figure 12:
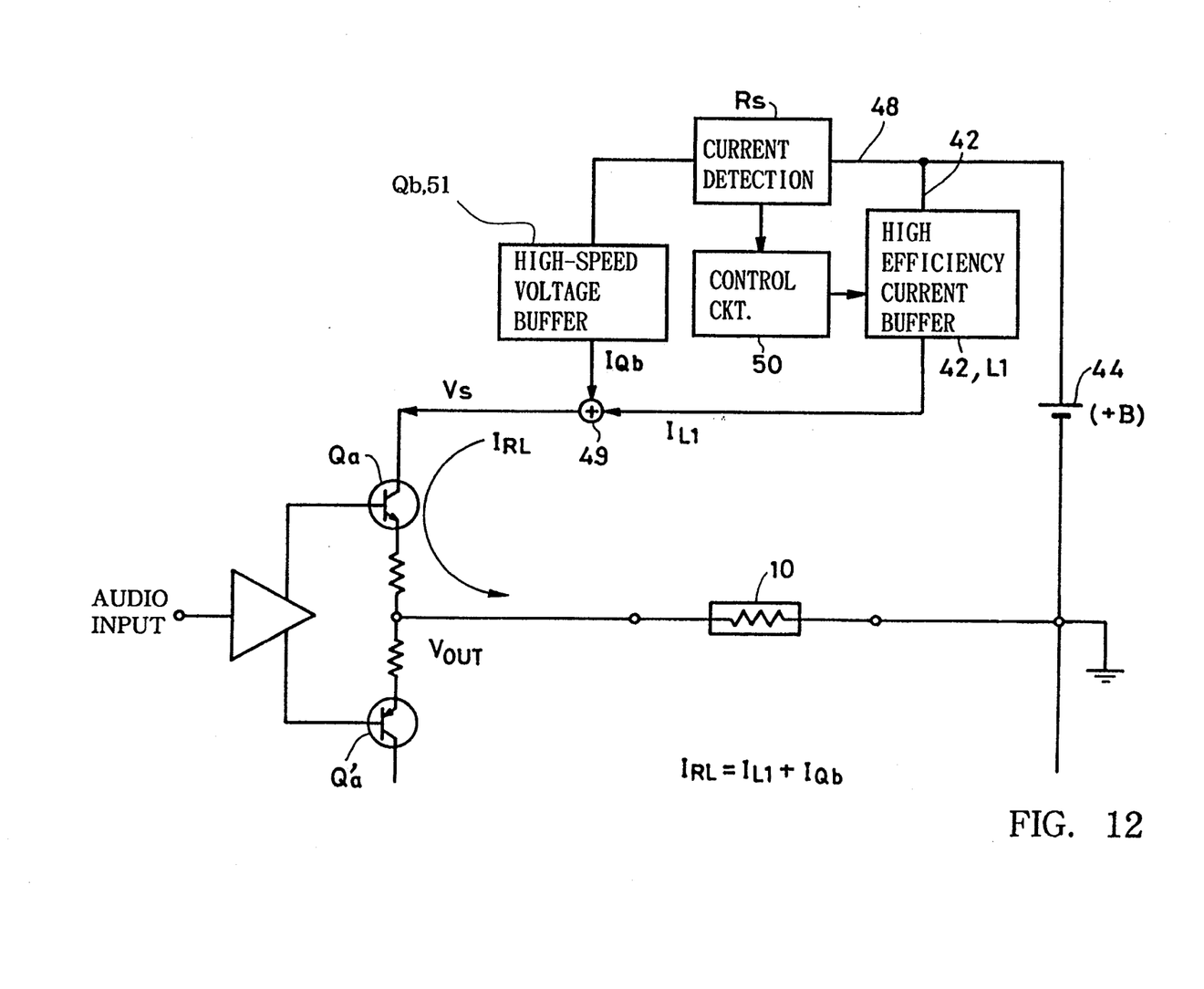
FIG. 12 is a block diagram schematically showing the circuit of FIG. 1.

The circuit of FIG. 1 can be considered to be equivalent in its concept to the circuit shown in FIG. 12. In this circuit, a high efficiency current buffer circuit (the switching transistor 42 and the smoothing inductor L1) which can supply current at a high efficiency but is slow in response to the change in an input signal is inserted in the main power source line 42 and a high speed voltage buffer circuit (the transistor Qb and the section 51 for controlling the base voltage thereof) which is quick in response to the change in the input signal but has a large loss inserted in the auxiliary power source line 48. The currents IL1 and IQb of the power source lines 42 and 48 are added together at the addition point 49 and the load current IRL (=IL1+IQb) is supplied to the load 10 through the transistor Qa. The current detection circuit (resistance Rs) detects the magnitude of the auxiliary current IQb and, controls the high efficiency current buffer circuit (42, L1) responsive to the detected current, a control circuit (hysteresis comparator 50) and thereby both the circuits adjusts the main current IL1. The high speed voltage buffer circuit (Qb, 51) supplies deficient current (IRL-IL1) in the main current line IL1 as the auxiliary current IQb.

The collector voltage Vs of the output transistor Qa is only slightly larger than the output voltage Vout and the loss of the output transistor Qa is thereby held at the minimum. As to the load current IRL, the auxiliary current IQb first responds to the sharp rising of an input and then the main current IL1 gradually dominates the load current. Since the auxiliary current IQb rises at an extremely high speed, no substantial deformation occurs in the output waveform. Since supply of the auxiliary current IQb is an operation lasting only a short period of time and energy is mainly supplied by the main current IL1 from the main power source line 42 which is of a small loss, efficiency as a whole increases. Thus, a power amplification circuit having a high efficiency and a fast through rate can be realized.

Figure 13:
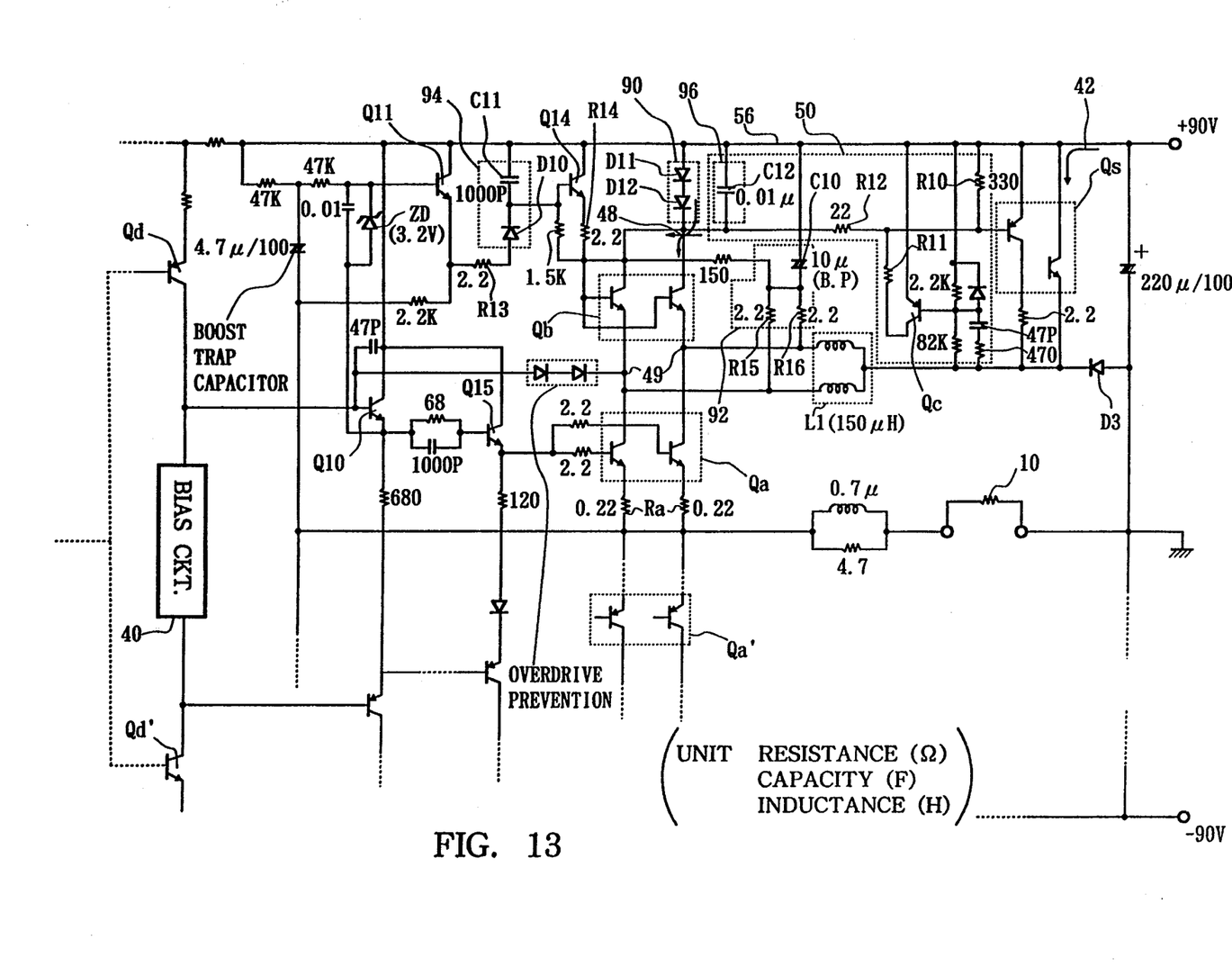
FIG. 13 is a circuit diagram showing a specific example of the circuit of FIG. 1.

A specific example of the circuit of FIG. 1 is shown in FIG. 13. In FIG. 13, the same component parts as those in FIG. 1 are designated by the same reference characters. In FIG. 13, the main power source line 42 supplies main current to the output transistor Qa through the switching transistor Qs, inductor L1 and current addition point 49. The auxiliary power source line 48 supplies auxiliary current to the output transistor Qa through resistances R10, R11 and R12, a current detection limiter 90 and transistor Qb. The section 51 of FIG. 1 which controls the base potential of the transistor Qb corresponds in FIG. 13 to the path including the emitter of a transistor Q10, Zener diode ZD, resistance R14 and the base of the transistor Qb. By this arrangement, when an input rises sharply, the base potential of the transistor Qb instantly rises and causes the auxiliary current to increase to respond to the sharp rise of the input and then the main current increases gradually and the auxiliary current decreases gradually.

The following arrangements are made in the circuit of FIG. 13:

(1) The output stage transistors Qa and cascade transistors Qb are respectively provided in parallel. The smoothing inductor L1 is correspondingly coil-wound in parallel. This structure enables generation of a large output. Besides, provision of a stabilizing resistance (e.g., resistance value of 0.22Ω) connected to the emitter of the cascade transistor Qb becomes unnecessary whereby loss in the stabilizing resistance can be prevented and a high efficiency can be realized. If the smoothing inductor L1 is constructed with a single winding, the current input point 49 must be a single point and the emitters of the cascade transistors Qb will necessarily be commonly connected. In this case, provision of resistance of e.g., 0.22Ωfor each emitter becomes necessary for stabilizing the operation current of the cascade transistors Qb to the expected degree. By winding the smoothing inductor L1 in parallel, there are provided two current input points 49. Since resistance of the coil windings, though it is very small, exists between them and, therefore, mutual interference in the operation of each cascade transistor Qb decreases with resulting alleviation of the stabilization problem. The emitter resistance of the cascade transistors Qb therefore becomes unnecessary and loss due to this emitter (stabilizing) resistance is eliminated.

(2) A ripple absorption circuit 92 (i.e., low-pass filter) consisting of resistances R15, R16 and a capacitor C10 is connected between the output of the smoothing inductor L1 and the power line 56. By this arrangement, a part of ripple component of the main current due to switching of the transistor Qs is led to an ac common potential point (power line 56) whereby burden upon the operation current of the cascade transistors Qb is decreased to some extent and increase of loss in the transistors Qb is prevented.

(3) The current detection limiter 90 consisting of diodes D11 and D12 is connected in parallel with the current detecting resistances R10, R11 and R12. Regarding these resistances R10, R11 and R12, when the switching transistor Qs is off (i.e., the transistor Qc is on), serial resistance is formed by the parallel resistance of the resistances (R10 and R11) and the resistance R12, when the switching transistor Qs is on (i.e., transistor Qc is off), serial resistance is formed by the resistances R10 and R12). By this arrangement, a current voltage which is detected by the current detecting resistances and then transmitted to the transistor Qs is restricted in its upper limit to 1.2 V whereby overdriving between the base and emitter of the transistor Qs is prevented and current can be supplied from the current detection limiter 90 to the cascade transistor Qb to improve the current supply capacity of the cascade transistor Qb (if the current path of the transistor Qb is current restricted by the resistance Rs (R10, R11 and R12), a large current cannot be supplied).

(4) A hold circuit 94 consisting of the capacitor C11 and the diode D10 is inserted in a path for connecting between the base potential of the cascade transistor Qb and the emitter potential (output potential) of the output stage transistor Qa. By this arrangement, a high frequency signal is detected in its peak value and is held in voltage by the capacitor C11 and, accordingly, the base potential of the cascade transistor Qb becomes a constant voltage and this prevents occurrence of deficiency of the emitter output voltage of the cascade transistor Qb for the operation of the output stage transistor Qa due to phase delay or other causes.

In this circuit, the collector-emitter voltage of the output stage transistor Qa is set to about 2 V. More specifically, the collector potential of the output stage transistor Qa is determined through four diode connections (0.6 V×4=2.4 V) from the upper potential of the Zener diode ZD, i.e., connection between the base and the emitter of the transistor Q11, the diode D10, connection between the base and the emitter of the transistor Q14 and connection between the base and the emitter of the transistor Qb. The emitter potential of the output stage transistor Qa is determined through two diode connections (0.6×2=1.2 V) from the lower potential of the Zener diode ZD, i.e., connection between the base and the emitter of the transistor Q15, and connection between the base and the emitter of the transistor Qa. That is, $(3.2-2.4)-(0-1.2)=2.0$ V becomes the collector-emitter voltage of the output stage transistor Qa. The upper potential and the lower potential of the Zener diode ZD are 3.2 V and 0 V respectively.

(5) A switching frequency fine adjustment circuit 96 consisting of a capacitor C12 is inserted in parallel in an auxiliary current value detection system. When an optimum design of a switching self-running system including the hysteresis comparator 50 and the switching transistor Qs is made, the switching frequency sometimes becomes very high (e.g., 100 kHz or over). By the provision of this switching frequency fine adjustment circuit 96, the switching frequency can be lowered to some extent and freedom of design can thereby be increased.

EMBODIMENT 2

Figure 14:
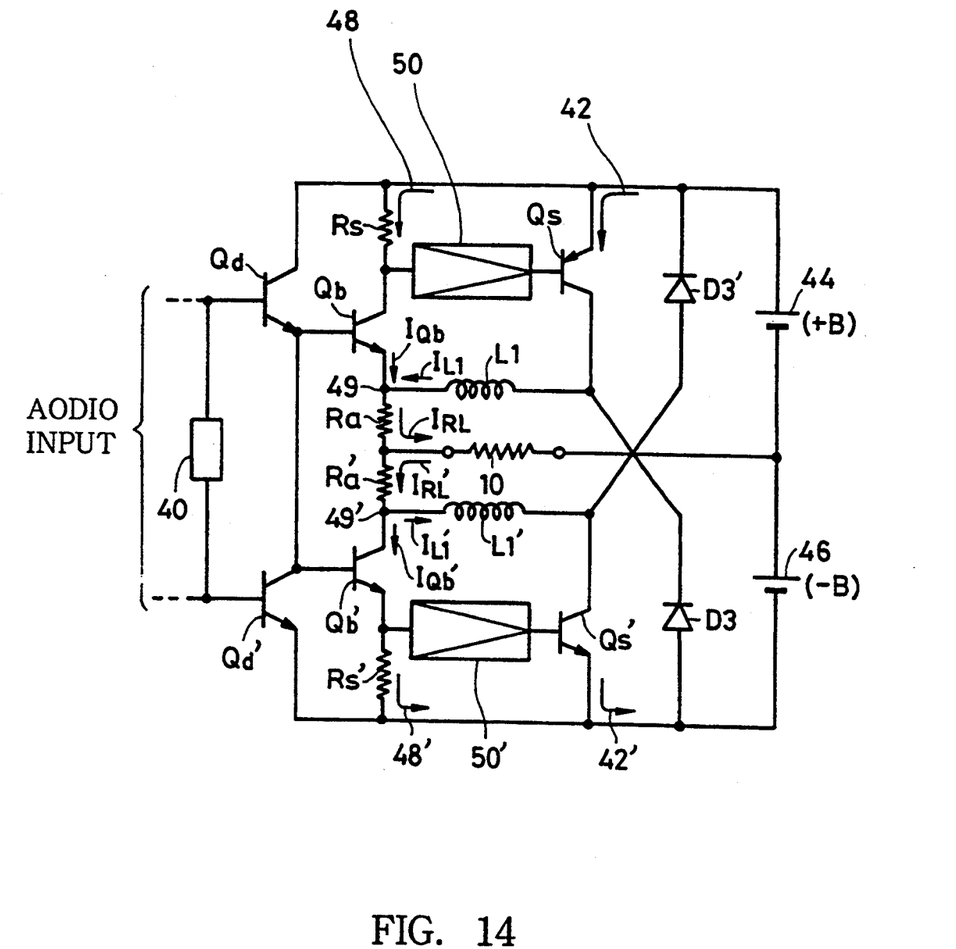
FIG. 14 is a circuit diagram showing a second embodiment of the invention.

Another embodiment is illustrated in FIG. 14, in which the transistor Qb of FIG. 1 concurrently performs the function of the transistor Qa. In FIG. 14, the same component parts as those of the embodiment 1 are designated by the same reference characters as those in FIG. 1. A part on the negative side, which corresponds to that of the positive side, will be shown with an apostrophe. One end each of flywheel diodes D3 and D3' is connected to a terminal of opposite power sources instead of being grounded. In this circuit, since values of auxiliary current IQb and IQb' are controlled by potential of current addition points 49 and 49', these addition points 49 and 49' constitutes the auxiliary power supply amount adjusting means.

This circuit performs almost the same operation as the circuit of FIG. 1. However, since in this circuit, the main power source lines 42 and 42' do not include the output transistors Qb and Qb' (corresponding to the transistors Qa and Qa' in FIG. 1), efficiency is thereby improved and the circuit is also simplified in comparison with the circuit of FIG. 1. As a ripple current of the auxiliary currents IQb and IQb' is produced from the output transistors Qb and Qb', this circuit is disadvantageous in characteristics in comparison with the circuit of FIG. 1. However, this circuit is advantageous when it is used in a case where only low frequency is produced as in an amplifier for a sub-woofer, for example, because in this case the values of the smoothing coils L1 and L1' can be increased and the ripple current can be minimized. Also, by employing a quickly operating switching element for the transistors Qs and Qs', the ripple current can be minimized without increasing the values of the smoothing coils L1 and L1', so that the circuit design can be simplified, though this is accompanied by increase of switching loss.

EMBODIMENT 3

Figure 15:
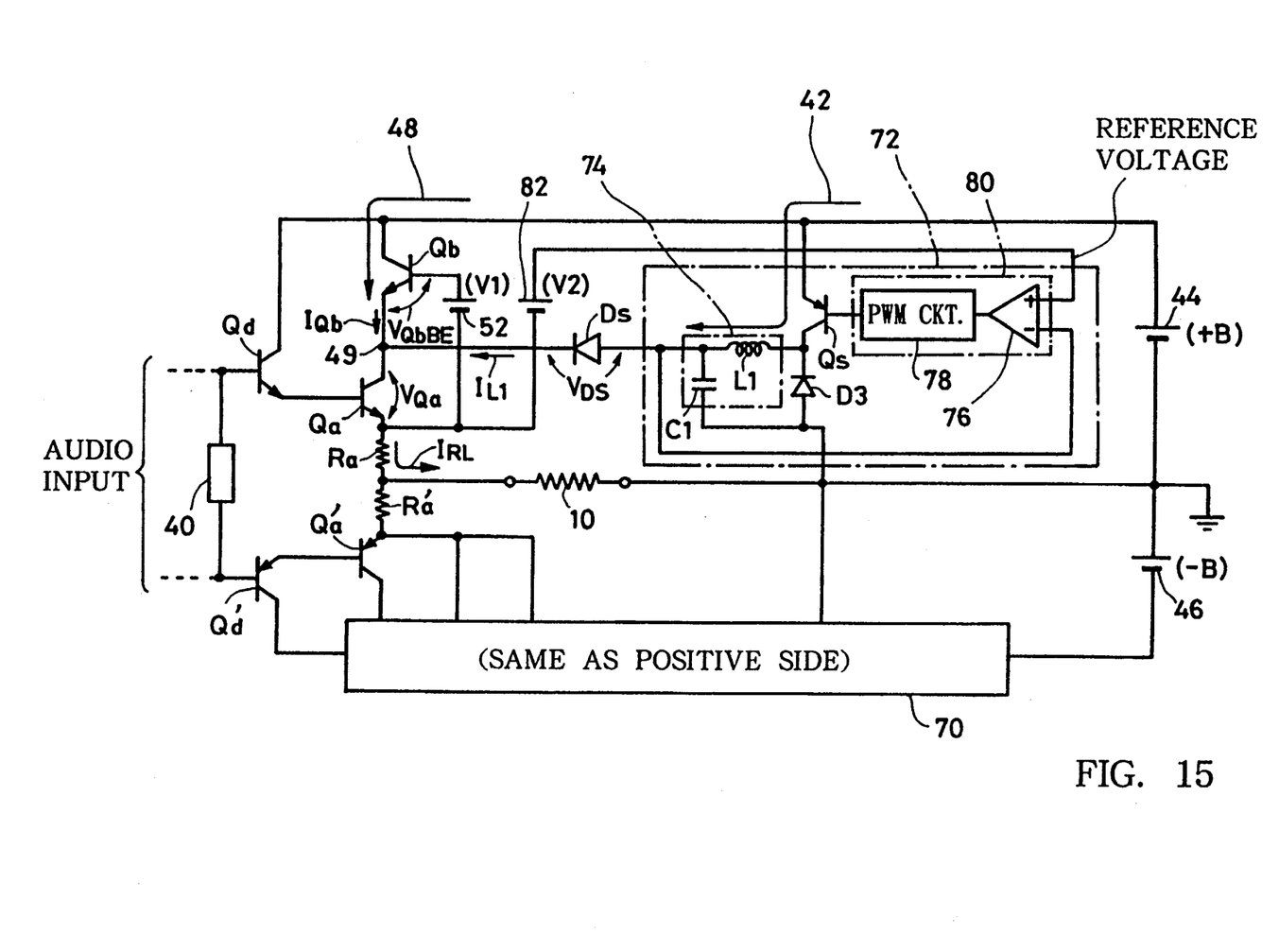
FIG. 15 is a circuit diagram showing a third embodiment of the invention.

FIG. 15 shows another embodiment of the invention. In this embodiment, the main power is supplied by inserting a switching series regulator, hereafter referred to as SSR, into the main power line 42 to switch the main power line 42, while for signals which rise so quickly that the SSR cannot respond to it, power is supplied by the transistor Qb of the auxiliary power line 48. In this embodiment, the power supply line to a load 10 is automatically switched in accordance with the level of voltage of the main power source line 42 and the auxiliary power source line 48. Power supply is normally made with high efficiency from the SSR 72 by setting output voltage of the SSR 72 higher, while in a case where an input signal has risen sharply and the output voltage of the SSR 72 cannot respond to it, power is supplied in quick response from the auxiliary power source line 48 by setting the output voltage of the auxiliary power source line 48 higher and thereby switching on the transistor Qb.

The circuit of FIG. 15 will now be described. In the circuit, the same component parts as those of the embodiment of FIG. 1 are designated by the same reference characters as those in FIG. 1. In FIG. 15, the circuit of the positive side only is illustrated. The negative side circuit 70 is constructed in the same manner as the positive side circuit and is driven by the power source 46 (power voltage −B). The following description will be made about the positive circuit only.

An audio signal is applied to transistors Qd, and Qd' of the driving stage through a bias circuit 40 to drive the transistors Qa and Qa' of the output stage and thereby supply necessary power to the load 10.

A main power source line 42 constituting a main supply source of power to the load 10 consists of a power source 44 (power voltage +B), an SSR 72, a diode Ds, the output transistor Qa and resistance Ra. An auxiliary power source line 48 for supplying a portion of necessary power which the main power line 42 cannot satisfy consists of the power source 44, a transistor Qb (auxiliary power supply amount adjusting element), the output stage transistor Qa and the resistance Ra.

A switching transistor Qs and a smoothing circuit 74 consisting of an inductor L1 and a capacitor C1 are inserted in the main power source line 42 of the SSR 72. The diode D3 is a flywheel diode to cause current of the coil L1 to flow when the switching transistor Qs is turned off. A comparator 76 and a PWM circuit 78 constitute switching control means 80. That is, the comparator 76 receives an output voltage of the SSR 72 at one input thereof and receives, at another input thereof, voltage obtained by shifting up an emitter potential of the output stage transistor Qa by voltage V2 of a dc power source 82 as reference voltage and then compares voltages of the two inputs. The PWM circuit 78 delivers out the compared output after pulse modulating it. More specifically, produces pulses having such periods that when the reference voltage is higher, the period of "0" is long and that of "1" is short, while when the reference voltage is lower, the period of "0" is short and that of "1" is long. Oscillation frequency of the PWM circuit 78 can be set below approx. 100 kHz (over 30 to 40 kHz), when a bipolar transistor is employed for the switching transistor Qs. When a power MOS transistor is employed, it can be set at a frequency over 100 kHz.

The switching transistor Qs is switched, being turned on when output of the PWM circuit 78 becomes "0", and turned off when it becomes "1". Output voltage of the switching transistor Qs is smoothed by the smoothing circuit 74 and delivered out. A diode Ds inserted between the output of the SSR 72 and the collector of the transistor Qa prevents current flow from flowing the auxiliary power line 48 to the output of the SSR 72 when the transistor Qb is on and current is being supplied from the auxiliary power source line 48.

The main power source line 42 and the auxiliary power source line 48 are connected to each other at a point 49. As the transistor Qb (the auxiliary power supply amount adjusting element) is turned on or off in accordance with potential at the point 49 against the emitter potential of the transistor Qa. This point 49 constitutes the auxiliary power supply amount control means.

A dc power source 52 is connected between the emitter of the output stage transistor Qa and the base of the transistor Qb. The dc power sources 52 and 82 reduce loss in the transistor Qa by maintaining the collector-emitter voltage VQa of the output stage transistor Qa within a minimum voltage at which the transistor Qa can be maintained in the on state.

Voltages V1 and V2 of the dc power sources 52 and 82 are set in the following manner: Voltage gain between the reference voltage input and the output of the SSR 72 is 1, and in order to turn on the transistor Qa by the output voltage of the main power source line 42, the voltage V2 is set to V2>VQamin+VDs, where VQamin is the minimum voltage at which the transistor Qa can secure linearity at its maximum output, which is normally about 2 V to 8 V, and VDs is the forward voltage of the diode Ds, which is approximately 0.6 V. In order to turn on the transistor Qa by the output voltage of the auxiliary power source line 48, the voltage V1 is set to (V1>VQamin+VQbBE). VQbBE is a base-emitter voltage of the transistor Qb when the transistor Qb is on, which is approximately 0.6 V. Moreover, in order to supply power from the SSR 72 by turning off the transistor Qb in case of a normal input (i.e., non-sharp input), V1 and V2 are set to (V2=V1+α), where α is an additional amount for V1 and is a positive value. In case of a dc input, the additional amount α is set in such a manner that the voltage V2 becomes slightly higher than the voltage V1. The additional amount, however, must be determined taking into consideration a phase delay in the smoothing circuit 74 caused by an ac component contained in the SSR 72. When it is desired to supply power up to at least a middle frequency range of tone signals with voltage from the SSR 72, the additional amount α must be set at a sufficient value taking into consideration decrease in the voltage VQa caused by this phase delay. By setting the value of the additional amount in this manner, the probability of the transistor Qb being turned on is decreased and increase of loss in the transistor Qb can thereby be prevented.

The operation of the circuit of FIG. 14, in which the voltages V1 and V2 are set in the above described manner, will be described. When an audio input rises quickly, the emitter potential of the transistor Qa is increased, and the base potential of the transistor Qb thereby is increased. However, as potential at the point 49 does not increase immediately, the base-emitter voltage VQbBE of the transistor Qb reaches approximately 0.6 V to turn the transistor Qb on. When the transistor Qb is turned on, necessary current IQb (=the load current IRL) is delivered out from the auxiliary power line 48 and applied to the load 10 through the output stage transistor Qa and the resistance Ra.

At this moment, in the SSR 72, the reference voltage input increases in accordance with the increase in the emitter potential of the transistor Qa, and the switching control means 80 increases ratio of the on-period of the PWM waveform to turn on the transistor Qs. The output voltage of the transistor Qs is smoothed by the smoothing circuit 74. As this smoothed output increases gradually and applied forward voltage of the diode Ds has reached approximately 0.6 V, the diode Ds is turned on. The emitter potential of the transistor Qb thereby increases, and the base-emitter voltage VQbBE falls below approximately 0.6 V to turn off the transistor Qb. Therefore, necessary current IL1 (=the load current IRL) is delivered out of the main power source line 42 and applied to the load 10 through the output stage transistor Qa and the resistance Ra.

In this manner, to respond quickly to a sharp rise of input, the auxiliary power source line 48 supplies power to the load 10 by the current IQb. Then, when output voltage of the main power source line 42 has sufficiently risen, the auxiliary power source line 48 is turned off to supply power from the main power source line 42. Since a high frequency component (a signal of a large variation) of a tone signal has a relatively small energy, the average value of the auxiliary current IQb is small and, most part of the load current IRL is supplied by switching drive as the current IL1 from the main power source line 42 whose efficiency is high. All load current IRL in the circuit of FIG. 15 is supplied from the transistor Qa (Qa'). However, as described above, the collector-emitter voltage VQa of the transistor Qa is only the minimum voltage VQamin+α necessary to turn the transistor Qa on, loss is very small at this part. Accordingly, efficiency of the circuit as a whole becomes very high. Moreover, for the sharp rise of the input Vin, necessary power for the load 10 can be supplied in quick response to the sharp rise by supplying power from the auxiliary power source line 48 having a quick response characteristic. Further, as the auxiliary power source line 48 is driven by a high voltage +B as is the main power source line 42, it can quickly follow a sharp rise of a large amplitude input and a predetermined maximum output can be supplied to the load without clipping the output.

Since the SSR as a normal stabilizing power supply produces only a dc current, cutoff frequency of the smoothing circuit can be set at a relatively low value, and an output ripple voltage therefore is low. However, the output of the SSR 72 of FIG. 15 is required to respond to high signal frequencies to some extent. For this reason, the cutoff frequency of the smoothing circuit 74 is required to be set to a high value, so that sufficient removal of ripple may not be achieved. However, since the output ripple voltage of the SSR 72 becomes the power supply of the output transistor Qa (i.e., the amplifier) and is removed to some degree by the amplifier having a power supply ripple removal ratio, the ripple voltage does not appear directly in the amplifier output. Also, in application such as a sub-woofer amplifier in which only low frequency is produced, the cutoff frequency of the smoothing circuit 74 can be set to a high value to reduce the ripple voltage. Further, when a switching element capable of switching at very high velocity is employed as the transistor Qs, the ripple voltage can be reduced without increasing the value of the smoothing circuit 74. Although switching loss in this case may be increased, this circuit design may be adopted if the advantage of loss reduction at the transistor Qb is larger than the disadvantage of increase in the switching loss.

The embodiment 1 of FIG. 1 may be considered to be more advantageous than the embodiment 3 of FIG. 15 in the following respects:

(1) In the circuit of FIG. 15, since operations of the transistor Qb and the SSR 72 are made by voltage, the voltage VQa must be changed in order to switch their power source lines. Therefore, VQa must normally have voltage more than VQamin+α applied thereto. In contrast, in the circuit of FIG. 1, the voltage input terminal is necessary for only the transistor Qb side, and the voltage VQa is always constant no matter from which side of the transistor Qb and the transistor Qs the current is flowing. Accordingly, normally, VQa has only to be slightly larger than VQamin and the additional portion α is not necessary, and the loss in the transistor Qa can thereby be reduced.

(2) In the circuit of FIG. 15, since the transistor Qb is off when the power is supplied form the SSR 72, the ripple voltage of the output voltage of the smoothing circuit 74 may be applied to the output transistor Qa and the ripple may appear in the output. In the circuit of FIG. 1, the auxiliary current IQb flows to cancel the ripple current produced from the smoothing coil L1, and the ripple portion is hardly delivered out in the output, so that deterioration in the distortion ratio and S/N can be prevented. In other words, the function of the transistor Qb differs in FIG. 1 and FIG. 15. In FIG. 15, the transistor Qb functions as a voltage source in case the SSR 72 can not serve in time, while in FIG. 1, it performs three functions, i.e. (a) a current source for a signal which rises sharply, (b) a current detection source to turn on the transistor Qs and (c) an active filter to absorb the output voltage ripple.

(3) The SSR 72 of FIG. 15 as the main power source line usually includes the comparator 76 and the PWM circuit 78, the latter having an oscillator and a voltage comparator. Since in the circuit of FIG. 1, the resistance Rs, the hysteresis comparator 50 and the smoothing coil L1 operate as a self-excited system and the hysteresis comparator 50 can be made in a simple manner as in FIG. 11, the circuit design can be simplified.

In the above described embodiments, the auxiliary power line and the main power line are driven by the single power source voltage +B. However, they can be driven by individual power source voltages, if these power source voltages can supply a maximum output for various inputs by the two power lines. In the above described embodiments, the invention is applied to the SEPP amplification circuit. The invention however can be applied also to other amplification circuits of various types.

What is claimed is:

1. An amplification circuit comprising:

power amplifying means for amplifying an input signal, the power amplifying means capable of being driven by receiving a source voltage;

a power source;

main power source supplying means for supplying a source voltage from said power source to said power amplifying means, said main power source supplying means comprising, a switching element, provided between said power amplifying means and said power source, for switching transmission of said power source voltage to said power amplifying means, smoothing means for smoothing a switching output through the switching element and switching control means for controlling a switching operation of the switching element;

auxiliary power source supplying means for supplementing a deficiency of said source voltage to permit the power amplifying means to be driven normally, said switching control means further comprising current detection means for detecting a current flowing through said auxiliary power source supplying means, said switching element being controlled in accordance with said detected current of said current detection means.

2. An amplification circuit comprising:

power amplifying means for amplifying an input signal, the power amplifying means capable of being driven by receiving a source voltage;

a power source;

main power source supplying means for supplying a source voltage from said power source to said power amplifying means, said power source supplying means comprising, a switching element, provided between said power amplifying means and said power source, for switching transmission of said power source voltage to said power amplifying means, smoothing means for smoothing a switching output through the switching element and switching control means for controlling a switching operation of the switching element;

auxiliary power source supplying means for supplementing a deficiency of said source voltage to permit the power amplifying means to be driven normally;

wherein said switching control means comprises current detection means and a hysteresis comparator, the current detection means for detecting a current flowing through said auxiliary power source supplying means and the hysteresis comparator for controlling an on/off timing of the switching element in accordance with detected current of said current detection means.

3. An amplification circuit as defined in claim 1 wherein said switching control means of said main power source supplying means comprises a switching series regulator.

4. A power source supplying system for a power amplifier comprising:

a power source;

high efficiency current buffer means for supplying power having a high efficiency current characteristic from said power source to the power amplifier;

high speed voltage buffer means for supplying power having a high speed voltage characteristic from said power source to the power amplifier;

current detection means provided between said power source and said high speed voltage buffer means for detecting a current flowing from said high speed voltage buffer means to the power amplifier; and control means for controlling output of said high efficiency current buffer means in response to said current detected by said current detection means.

5. A power source supplying device for a power amplifier comprising:

a power source;

a switching transistor, an emitter of which is connected to the power source;

a smoothing circuit connected to a collector of the switching transistor;

a hysteresis comparator, an output side of which is connected to a base of the switching transistor, the hysteresis comparator outputting a control voltage having a hysteresis characteristic;

current detection resistor, one end of which is connected to the power source and the other end of which is connected to the input side of the hysteresis comparator;

a transistor, a collector of which is connected to the input side of said hysteresis comparator and an emitter of which is connected to the output side of said smoothing circuit; and an output stage transistor for supplying power to drive a load, a collector of which is connected to a connection point of said transistor and said smoothing circuit, wherein a base of the transistor and an emitter of the output stage transistor are connected so as to have a predetermined potential difference between each other.

6. A power source supplying device as defined in claim 5 wherein a diode is connected at a connection point of said switching transistor and said smoothing circuit in parallel.

7. A power source supplying device as defined in claim 5 wherein said smoothing circuit comprises an inductance.

8. A power source supplying device as defined in claim 7 wherein the inductance of the smoothing circuit comprises plural coils provided in parallel.

* * * * *